United States Patent
Ishiwa et al.

(10) Patent No.: US 6,653,572 B2
(45) Date of Patent: Nov. 25, 2003

(54) MULTILAYER CIRCUIT BOARD

(75) Inventors: Masayuki Ishiwa, Hiratsuka (JP); Kenji Iizuka, Hiratsuka (JP); Takeshi Nishimura, Yokohama (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/779,691

(22) Filed: Feb. 7, 2001

(65) Prior Publication Data

US 2002/0104681 A1 Aug. 8, 2002

(51) Int. Cl.⁷ .................................................. H05K 1/00
(52) U.S. Cl. ........................................ 174/250; 361/719
(58) Field of Search ................................ 174/250, 258, 174/259, 255; 361/719, 790, 803, 712, 713, 707, 708, 717, 718, 720, 721, 722

(56) References Cited

U.S. PATENT DOCUMENTS

| | | | | |
|---|---|---|---|---|
| 3,436,819 A | * | 4/1969 | Lunine | 29/625 |
| 3,466,206 A | * | 9/1969 | Beck | |
| 3,606,677 A | * | 9/1971 | Ryan | 29/628 |
| 3,795,047 A | * | 3/1974 | Abolafia et al. | 29/625 |
| 4,155,321 A | * | 5/1979 | Tamburro | 113/119 |
| 4,249,302 A | * | 2/1981 | Crepeau | 29/830 |
| 4,803,450 A | * | 2/1989 | Burgess et al. | 333/238 |
| 5,329,068 A | * | 7/1994 | Hirata et al. | |
| 5,615,477 A | * | 4/1997 | Sweitzer | |
| 5,726,500 A | * | 3/1998 | Duboz et al. | |
| 5,786,986 A | | 7/1998 | Bregman et al. | |
| 5,798,563 A | * | 8/1998 | Feilchenfeld | |
| 5,889,655 A | * | 3/1999 | Barrow | |
| 5,995,379 A | * | 11/1999 | Kyougoku et al. | 361/803 |
| 6,012,221 A | * | 1/2000 | Campbell | |
| 6,222,136 B1 | * | 4/2001 | Appelt et al. | |

\* cited by examiner

Primary Examiner—David L. Talbott
Assistant Examiner—Jeremy Norris
(74) Attorney, Agent, or Firm—Knobbe Martens Olson & Bear LLP

(57) ABSTRACT

A multilayer circuit board formed by integrally laminating a plurality of printed wiring boards in a multilayer structure so as to provide air gaps therebetween. An insulating layer is formed on each of both surfaces of a metal core substrate having through-hole forming apertures and a printed wiring layer is formed on the each insulating layer. Metal projections integrally formed on the metal core substrate serve as bonding electrodes between the adjacent wiring boards in the multilayer structure. The width of the air gap provided between the adjacent wiring boards is determined by the height of the metal projections.

10 Claims, 6 Drawing Sheets

MULTILAYER CIRCUIT BOARD

BACKGROUND OF THE INVENTION

1. Field of the Invention

The present invention relates to a multilayer circuit board well suited for high density mounting of electronic devices such as semiconductor devices and more particularly to a structure of a multilayer circuit board formed by laminating together a plurality of printed wiring boards.

2. Related Background Art

As the result of a recent trend towards realizing a greater degree of integration of semiconductor devices, the density of wiring patterns on printed wiring boards (PWB) for carrying such semiconductor devices has become increasingly higher and higher. For instance, lead less chip-types have become the main current in the actual mounting forms of various electronic devices including semiconductor devices as well as resisters and capacitors, and high density surface mounting techniques for directly soldering chip-type devices on the printed wiring of a PWB to realize a high density mounting on the PWB have already been developed.

With the advent of higher levels of mounting forms, there has been an increase in the thermal stress at the soldered bonded joints between electronic devices, particularly semiconductor chips and a PWB thus giving rise to a danger of increasing the rate of occurrence of cracking at the bonded joints. To overcome this danger, measures have been proposed to reduce the coefficient of linear expansion of a substrate constituting a PWB so as to be close to that of the semiconductor chips. For instance, a glass epoxy multilayer substrate FR-5, formed by laminating a plurality of epoxy resin impregnated glass fabrics made from T-glass fibers having a low coefficient of linear expansion and used as reinforcement material, has been commercially available and PWBs formed from these substrates have already been put in practical applications.

However, the PWB formed from such a substrate reinforced with T-glass fibers has a coefficient of linear expansion in the range from 7 to 10 ppm and this rate is still large as compared with the coefficient of linear expansion, i.e., 3 ppm, of silicon semiconductor chips, for example. In other words, even if such a PWB is used, a thermal stress caused within the PWB due to temperature variations suffering during the mounting of electronic devices by soldering or during the use cannot be reduced so much, and the danger of causing cracking in the soldered layer at the bonded joints between the silicon chips and the wiring on the PWB still remains unsolved. In this case, in order to prevent the occurrence of cracking in the soldered layer, it is rather necessary to effect an additional procedure of filling the gaps between the silicon chips mounted on the PWB and its surface with a resin to reduce the thermal stress.

Also, the effect of the glass fibers or the reinforcement material of the substrate does not practically act on the through-holes formed in the PWB and thus the local coefficients of linear expansion in the axial direction of the through-holes show large values ranging from 50 to 150 ppm. Thus, due to the thermal stress caused by variations in the ambient temperature, there is the danger of causing a damage leading to any electrical break in the copper plating applied into the through-holes or the conductive paste (e.g., copper paste) filling the through-holes.

On the other hand, the formation of through-holes for providing electric connections between the respective layers is essential in the case of a multilayer printed wiring board (MPWB). Conventionally, a drill is used to form holes through the substrates for the formation of the required through-hole portions, and this method not only increases the number of drilling operations with an increase in the number of holes thus requiring much labour and time, but also has the danger of causing a gap due to separation at the substrate resin/glass fiber interface inside any through-hole due to the shock of drilling operation and causing the migration of copper ions from the copper plating layer formed on the through-hole inner surface into the gap, i.e., a so-called migration phenomenon. Such migration must be avoided by all means since it results in the deterioration of the electrical insulation performance between the respective through-holes or between the through-holes and other printed wiring.

According to the series of processing steps hitherto used for the fabrication of an MPWB, a plurality of double-sided printed wiring boards are first prepared and, after the double-sided printed wiring boards have been laminated together and subjected to the application of pressure at once, one or more through-holes are formed in this multilayer structure and a plating layer is formed on the inner surface of the through-holes. In this case, while the laminating process can be effected efficiently by pressing the plurality of double-sided printed wiring boards as a whole, the following through-hole forming procedure is inevitably required to collectively form the desired through-holes through the whole layers and the positions of the through-holes at the respective layers cannot be arbitrarily selected independently. Thus, there is the disadvantage of deteriorating the degree of freedom in wiring designing.

Also, in order to ensure improved electromagnetic noise shielding function and intercicuit crosstalk withstanding performance, it is desirable as one countermeasure to provide shielding layers between the respective layers of an MPWB. However, simply adding shielding layers between the respective layers only results in a considerable increase in the number of constituting layers as a whole and the resulting increase in cost cannot be avoided.

In consideration of applications in the high frequency range, the wiring formed on a PWB must be designed as transmission lines. In the case of the conventional PWB or MPWB, however, the provision of ground layers between the respective layers tends to considerably increase the number of wiring layers and this is disadvantageous from the standpoint of economy. Despite this fact, the absence of such ground layers tends to make it difficult to provide the desired impedance matching of the transmission lines and this eventually makes it extremely difficult to supply PWBs or MPWBs which are well suited for use in high frequency applications and are low in cost.

Attempts have already been made for solving such problems. As for example, there has been proposed a multilayer structure including a plurality of PWBs in which the substrates constituting the adjacent layers are bonded together through local mounds such as raised bumps formed from insulating resin, e.g., polyimide, solder balls or raising of conductive patterns so as to form an air gap between the two substrates (See, for example, U.S. Pat. No. 5,786,986). By means of the air gaps formed between the substrates, not only the dielectric loss of the high frequency circuits can be decreased, but also the occurrence of thermal stress due to a difference in linear expansion can be greatly decreased as compared with the case where shielding material having a high coefficient of linear expansion e.g., organic material is present around the bonded joints between the electrodes of the wirings, thereby ensuring improved reliability of the bonded joints as well as the improved heat dissipating properties and reduced weight of the whole assembly.

In this case, the size of the air gaps between the adjacent substrates is determined depending on the thickness of the local mounds such as the bumps, balls or raised portions. Where solder balls are used for the formation of local mounds, essentially it is difficult to make nonuniform the amount of application of solder on the same substrate and also, in the case of soldering for bonding by passing through a reflow furnace, there is the danger of the solder balls between the substrates being collapsed excessively due to the load applied to the substrates, thus making it extremely difficult from the production technical point of view to uniformly control the size of air gaps between the adjacent substrates at the desired value.

Where raised bumps of insulating resin are disposed between the adjacent substrates, the coefficient of linear expansion in the substrate thickness direction is determined by the resin forming the bumps. The coefficient of linear expansion of the raised resin is generally as high as between 50 and 150 ppm and its ill effect on the bonded joints between the substrate and electronic devices is still unavoidable. In addition, separation between the printed wiring conductor, e.g., copper and the raised resin tends to occur easily and the mechanical strength of bonded joints between the substrates is low in reliability.

SUMMARY OF THE INVENTION

It is the primary object of the present invention to provide a multilayer circuit board capable of effectively preventing the occurrence of cracking at the bonded joints between the printed wirings formed on substrates and electronic devices bonded thereon by soldering.

It is another object of the present invention to provide a multilayer circuit board formed by laminating a plurality of printed wiring boards and capable of preventing the occurrence of cracking at the bonded joints as mentioned previously, more particularly such multilayer circuit board capable of realizing bonded joints having a sufficient mechanical strength and air gaps having a stable spacing dimension between the adjacent substrates and excellent in freedom of wiring designing than conventional MPWBs as well.

In accordance with a basic concept of the present invention, a multilayer circuit board has a multilayer structure of a plurality of printed wiring boards including at least a first printed wiring board and a second printed wiring board, and each of said first and second printed wiring boards includes a metal core substrate having a first major surface and a second major surface which are opposite and parallel to each other and each of which major surfaces is covered with an electrically insulating layer, a conductive printed wiring layer formed on the surface of said electrically insulating layer, a solder resist layer covering the surface of said conductive printed wiring layer, and local bonding means for mechanically bonding together a pair of the printed wiring boards which are adjacent to each other so as to provide an air gap of a predetermined spacing value between these adjacent printed wiring boards in the multilayer structure. The metal core substrate is provided with at least one preliminarily prepared aperture extending through the first and second major surfaces to form a through-hole. The local bonding means includes a plurality of metal projections of a predetermined height which are formed on the first major surface and/or the second major surface so as to be integral with the metal core substrate and to provide an air gap between the adjacent printed wiring boards in the multilayer structure. Preferably, the metal projections are formed into a spot shape, linear shape or planar shape of a limited area. The conductive printed wiring layer formed on the electrically insulating layer includes a plurality of wiring lines on the first or second major surface and a through-hole conducting portion on the inner surface of the aperture. The solder resist layer includes a local opening made so that the metal surface is exposed at the region of the local bonding means.

In accordance with an advantageous embodiment of the present invention, each of the metal projections includes an exposed metal top of its own.

In accordance with another advantageous embodiment of the present invention, each metal projection includes an exposed metal surface layer formed by plating the metal core substrate with a metal.

In accordance with still another advantageous embodiment of the present invention, each metal projection has a top covered with an electrically insulating layer on which an exposed metal surface layer is formed by plating a metal. This exposed metal surface layer can constitute a part of the conductive printed wiring layer.

In accordance with still another advantageous embodiment of the present invention, each metal projection includes a protrusion formed from the metal core substrate by press forming.

In accordance with still another advantageous embodiment of the present invention, each metal projection includes a protrusion left after etching treatment of the metal core substrate.

In accordance with still another advantageous embodiment of the present invention, the second major surface of the first printed wiring board and the first major surface of the second printed wiring board face each other through an air gap, and the local bonding means includes a combination of a metal projection formed on one of the second major surface of the first printed wiring board and the first major surface of the second printed wiring board and a local exposed metal portion provided on the other of the second major surface of the first printing wiring board and the first major surface of the second printed wiring board a at position which is in alignment with the metal projection. This exposed metal portion can be formed from a part of the surface of the metal core substrate or a part of the conductive printed wiring layer and it can be utilized, along with the metal projection, as the required electrode for electrical connection between the adjacent printed wiring boards.

In a multilayer circuit board according to the present invention, the both surfaces of each of metal core substrates are each covered with an electrically insulating layer and individual printed wiring boards are formed by utilizing the metal core substrates each covered with the insulating layers. Thus, the structural strength of the printed wiring board is governed by the rigidity of the metal core substrate and the coefficient of linear expansion of the printed wiring board per se is substantially the same with that of the metal core substrate. Thus, if a metal material having as low a coefficient of linear expansion as that of a material used for forming semiconductor devices, e.g., silicon is selected for a metal core substrate, it is possible to prevent the occurrence of an excessive thermal stress at the soldered joint between a printed wiring board and a semiconductor device mounted thereon due to a difference in coefficient of linear expansion between the two as well as the resulting occurrence of cracking.

Preferably, if the same metal material is used as the material for the metal core substrates of a plurality of printed wiring boards forming a multilayer structure, the printed wiring boards of the respective layers become substantially equal in coefficient of linear expansion to each other so that the difference in surface-direction thermal stress among the printed wiring boards in the multilayer structure is reduced extremely with respect to the effect of heat, e.g., the heating during such production and assembling processes as a reflow process and the generation of heat in the actual use, thereby greatly reducing the occurrence of internal stress at the soldered joints between the printed wiring boards.

Particularly, in a multilayer circuit board according to the present invention, integrally formed on the first major surface and/or second major surface of each of metal core substrates are metal projections which provide bonded local joints between the respective printed wiring boards in the multilayer structure and the thickness-direction coefficient of linear expansion of the individual printed wiring boards is also determined by the metal projections, that is, by the metal material used for the metal core substrates, thereby ensuring enhanced mechanical stability against heat at the bonded joints between the printed wiring boards in the multilayer structure. In addition, the gap width of air gaps formed between the respective adjacent printed wiring boards laminated in the multilayer structure is also determined by the height of the metal projections. The metal projections can be formed preliminarily with a highly accurate projection height by etching, e.g., subtractive process or electroplating, e.g., additive process effected on one or both surfaces of each metal core substrate. Thus, in accordance with the present invention, the air gaps between the respective printed wiring boards in the multilayer structure can be formed with the desired spacing value by preliminarily controlling the height of the metal projections in contrast to those formed by solder bumps, and at the same time these air gaps can be realized as highly accurate parallel gaps by preliminarily controlling the height of the plurality of metal projections at a given value.

Also, in accordance with the multilayer circuit board of the present invention, it is possible to design so that the metal core substrates forming the printed wiring boards of the respective layers not only exhibit electric shielding performance but also serve the function of balanced strip lines as high frequency transmission lines or the function of the grounds of microstrip lines, for example. Thus, in such a case, a multilayer circuit board can be realized which makes easy the matching of circuit impedance and which is suited for use in high frequency applications.

Further, in accordance with the multilayer circuit board of the present invention, the through-hole forming apertures have been preliminarily made in the metal core substrates so that there is provided the multilayer circuit board which has no need to drill through-holes in the printed wiring boards after the formation of printed wiring patterns of electric circuitry as in the case of the prior art, which involves no danger of the delamination at the internal lamination interface of the printed wiring boards due to the shock during drilling as well as the resulting migration and the like and which is capable of highly maintaining the inter-through-hole electric insulating performance over a long period of time. In addition, due to the fact that the formation of through-holes at the desired positions is possible for each of the individual printed wiring boards forming the multilayer structure, the degree of freedom from the standpoint of wiring designing is very greatly improved over the prior art multilayer circuit boards in which through-holes are formed at once through the whole layers after the plurality of printed wiring boards have been laminated.

In accordance with the multilayer circuit board of the present invention, a part of the surface of the metal core substrates in each of the printed wiring boards can be selectively exposed so that the exposed metal portions can be utilized as bonding electrodes between the respective printed wiring boards in the multilayer structure. In this case, the adjacent printed wiring boards can be directly bonded together electrically and mechanically. As a result, the bonded joints between the printed wiring boards are high in reliability and the structural strength of the multilayer circuit board as a whole is also high. As regard the combination of the bonding electrodes, it is only necessary to combine the bonding electrodes formed on the metal projections of one of the adjacent printed wiring boards with the exposed metal portions formed selectively, the exposed metal portions formed on the metal projections or the plated electrodes formed on the insulating layer in the metal core substrate of the other printed wiring board.

It is to be noted that the metal projections integrally formed on the metal core substrate can be made to extend linearly or in a frame manner along the substrate periphery. In the later case, by forming a multilayer structure with a plurality of such printed wiring boards, the surroundings of the air gaps are enclosed with electromagnetic shielding by the metal projections forming a frame or an enclosure so that any electromagnetic interference between the electronic circuitry mounted on the printed wiring boards and the outside, that is, any undesired electromagnetic radiation from the electronic circuitry to the outside or the introduction of noise into the electronic circuitry from the outside can be effectively prevented.

The above and other features and advantages of the present invention will become more apparent from the following description of the preferred embodiments shown only for illustrative purposes without no intention of limitation of the scope of the present invention, when taken in conjunction with the accompanying drawings.

DESCRIPTION OF THE PREFERRED EMBODIMENTS

In the first embodiment of the present invention as shown in FIG. 1, a metal sheet 1 made from a so-called "42 alloy" (an alloy containing Ni:42%, Fe:58%) and having a thickness of 100 $\mu$m is used as a metal core substrste. The core substrate 1 has a flat first major surface (the upper side in the Figure) and a second major surface (the lower side in the Figure) which is parallel to the former. A plurality of metal projections T are preliminarily formed on the second major surface to serve as bonding electrodes. The forming process of these metal projections is as follows.

Figure 1A:
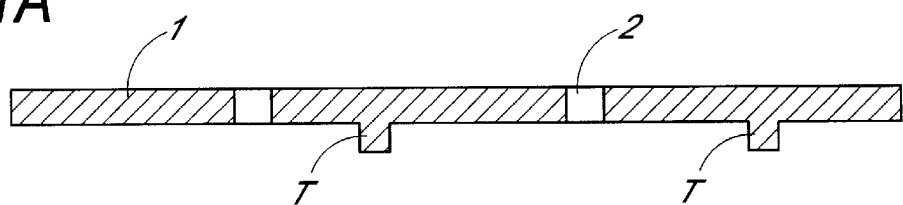
FIGS. 1a to 1e are schematic sectional views showing in the order of processing steps the construction of a double-sided printed wiring board which is a constitutional element of a multilayer circuit board according to a first embodiment of the present invention.

In other words, a plurality of bonding electrode forming sites are preliminarily selected on the second major surface of the metal core substrate according to design information and metal projections T of a height corresponding to the desired value of an air gap to be provided later are formed on all of or selected ones of these sites. In the first place, a plating resist is applied to one surface (this constitutes the second major surface) of the 42 alloy metal sheet serving as a starting material and then a mask prepared according to the previously mentioned design information is applied on the plating resist coating layer, thereby exposing the resist. After the exposure, the resist is developed so that the metal surface of the 42 alloy metal sheet is exposed only in the regions corresponding to the bonding electrode forming sites. Then, the electroplating of copper is applied onto the exposed metal regions to form metal projections T of 10 $\mu$m in diameter and 70 $\mu$m in height. Note that the plating metal is not limited to copper and any other metal which is excellent in conductivity and solderability, e.g., nickel can also be used. In the metal core substrate formed with the metal projections T in this way, apertures 2 of 100 $\mu$m in diameter are formed in and through the first and second major surfaces by etching so as to provide through-holes (FIG. 1a).

Figure 1B:
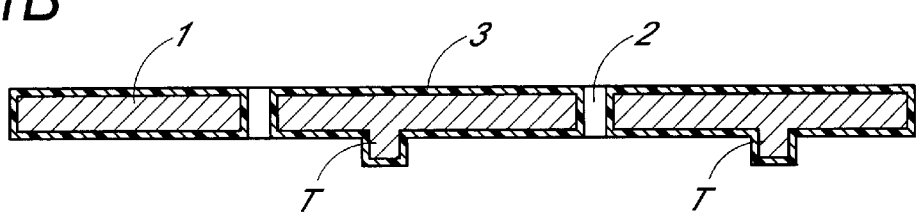

Next, the whole surface of the metal core substrate 1 including the inner surface of the apertures 2 is covered with a polyimide thin-film layer (insulating layer) 3 of 20 $\mu$m thick by electrophoretic process (FIG. 1b). The electrophoretic process used here is as follows. As the emulsion required for electrophoresis, an emulsion is prepared in which 175 g of N-methyle-2-pyrrolidone (NMP) containing 1.4 wt % of polyamid acid (PAA), precursor of polyimide, is colloidally dispersed in 175 g of a poor solvent or mesityl oxide and 6.3 g of N-methylimidazole is added to the prepared emulsion as a charging agent for negatively charging the PAA. In the process of electrophoresis, employing the 42 alloy metal core substrate as a positive electrode and a copper or stainless steel sheet as a negative electrode, a reaction is effected for 8 minutes while stirring the emulsion by a stirrer with an interelectrode spacing of 20 mm and an applied voltage of 60 V. The surface of the resulting polyimide thin-film layer 3 is wetted with alkali and then roughened.

It is to be noted that the reagents usable for the electrophoresis are not limited to the above-mentioned one and, dimethyle sulfboxide (DMF) which is a good solvent for the PAA, may be used in place of the NMP. Also, butyl acetate or methanol may be used in place of mesityl oxide which is a poor solvent for the PAA.

Figure 1C:
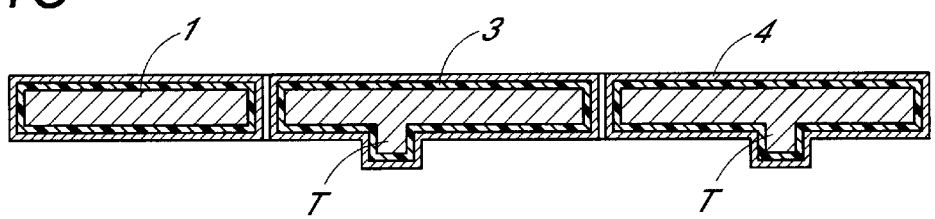

Next, a film of copper is formed on the roughened surface of the polyimide thin-film layer 3 by a well known electroless plating method. More specifically, after the polyimide thin-film layer has been wetted with alkali to roughen its surface, it is neutralized with acid and subjected to polarization. Then, after the processes including pre-dip, catalysis and accelerator, electroless copper plating is effected at 40° C. for 20 minutes in an alkaline environment. The principal components of the plating solution include copper sulfate as a source of copper ions, sodium hydroxide as a source of alkali, formic aldehyde as a reducing agent and EDTA as a chelating agent. A layer of copper is further formed by electroplating on the electroless copper plated layer to form a copper layer 4 having a thickness of 20 $\mu$m (FIG. 1c).

Figure 1D:
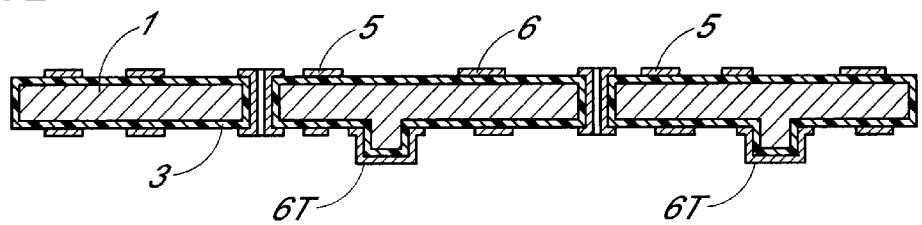
Figure 1E:
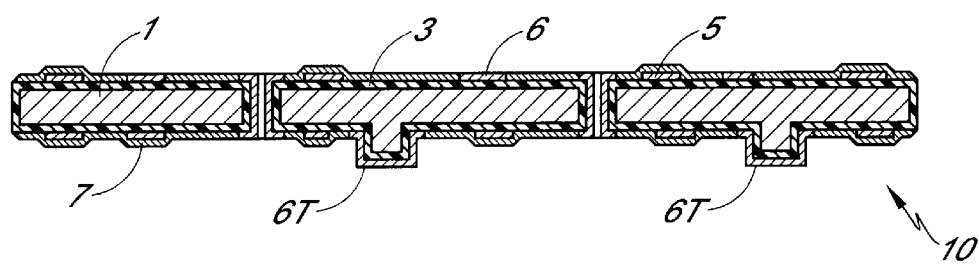

Thereafter, an etching resist is applied to the whole surface of the copper layer 4 including the inner surface of the apertures 2 and a mask corresponding to a desired circuit pattern is applied to each of the first and second major surfaces to expose the resist layer. Then, the exposed resist layer is successively subjected to developing and etching processes to form printed wiring layers 5 including bonding electrodes 6 and 6T (FIG. 1d). Thereafter, excluding the top regions of the electrodes 6 and 6T, the whole substrate surface including the surface of the printed wiring layers 5 are covered with solder resist layers by printing, thus producing a double-sided printed wiring board 10 having the flat electrodes 6 on the first major surface and the raised electrodes 6T on the metal projections T (FIG. 1e). According to the measurement of the coefficient of linear expansion of the wiring board 10 effected in the temperature range between 0 and 100° C., it is 4 ppm which is close to the coefficient of linear expansion of silicon chips, i.e., 3 ppm.

Figure 2:
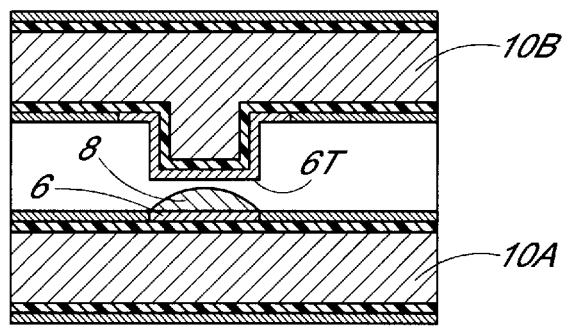
FIG. 2 is a schematic enlarged sectional view showing the bonded joint in a laminating process of double-sided printed wiring boards according to the first embodiment.

A multilayer printed wiring board is produced by laminating a plurality of the double-sided printed wiring boards produced by these processes. In this case, as shown in FIG. 2, the bonding between a first double-sided printed wiring board 10A and a second double-sided printed wiring board 10B to be placed upon another is effected by bonding together the electrodes (6, 6T) formed at the mutually opposing positions on the respective printed wiring boards through a solder 8. In order to provide the bonding between the electrodes of the two printed wiring boards, it is only necessary that at least the electrodes on one of the printed wiring boards are the electrodes 6T formed on the regions of the metal projections T or alternatively the electrodes 6T formed on the metal projections T of the two printed wiring boards may be bonded together (in this case, however, the width of the air gap becomes substantially two times the height of the metal projections T).

In the process for laminating a plurality of double-sided printed wiring boards and bonding together at the electrodes thereof, it is necessary to perform a soldering operation for the bonding in a condition where the electrodes for providing bonded joints between the wiring boards are in accurate registration with each other. Thus, when forming a multilayer structure, it is desirable to provide a registration jig for the registration of wiring boards and the prevention of shift in registration.

Figure 3A:
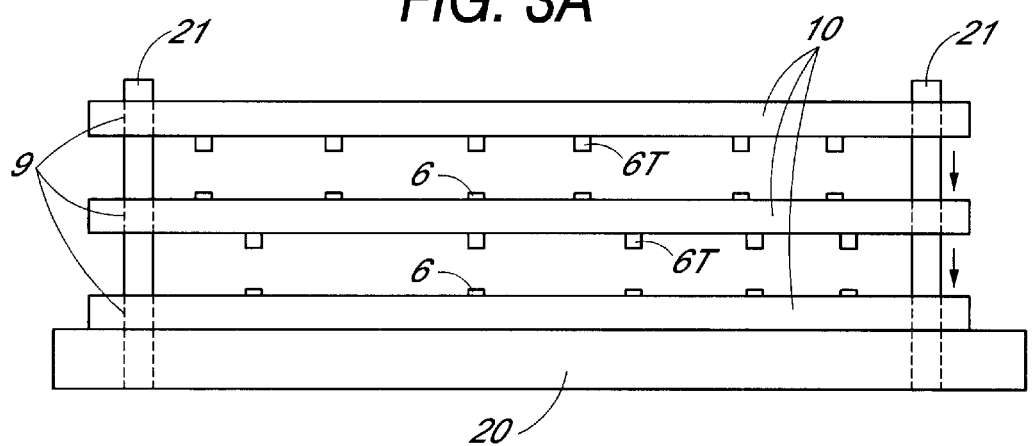
FIGS. 3a and 3b are explanatory diagrams showing an exemplary alignment method for a plurality of double-sided printed wiring boards in a laminating process.
Figure 3B:
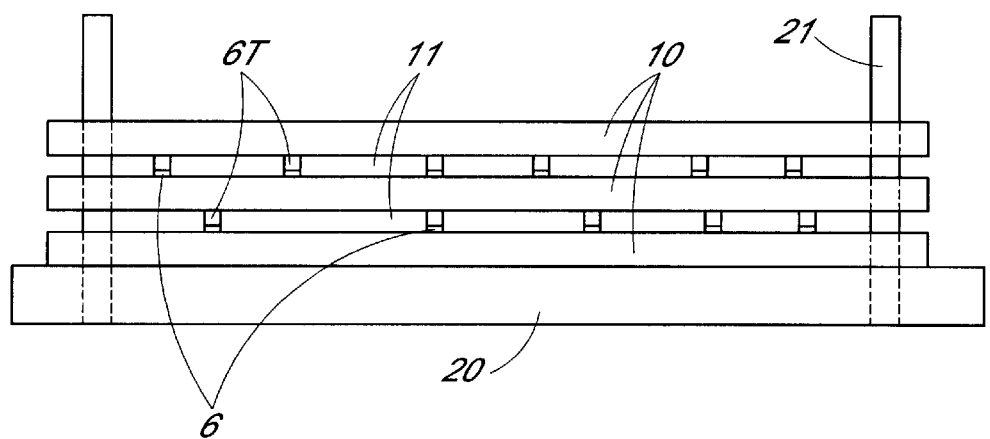

For instance, where three printed wiring boards 10 are to be laminated as shown in FIGS. 3a and 3b, a plurality of reference apertures 9 are first formed through these printed wiring boards and the positions of these apertures 9 are preliminarily selected so as to ensure the proper contacting between the electrodes (6, 6T) of the printed wiring boards which are subject to bonding. As for example, a fixed stand composed of a base plate 20 and a plurality of reference pins 21 erected on the base plate as shown in FIG. 3a is provided as the previously mentioned jig. The printed wiring boards 10 are successively placed one upon another on the base plate 20 in such a manner that the reference pins 21 extend through the reference apertures 9 and thus a highly accurate registration is more naturally accomplished for the wiring boards 10.

In the multilayered condition with the registration on the base plate 20 being effected by the reference pins 21, all the printed wiring boards 10 laminated in this way are passed, as such and together with the base plate 20, through a reflow furnace which is preset so that the passage requires the lapse time of 20 seconds at the peak temperature of the bonded joints of 250° C., for example, thereby bonding together the electrodes by the fusion of their solder and thus forming a multilayer circuit board. In this multilayer circuit board, air gaps 11 corresponding to the height of the metal projections T are formed around the electrode joints in the spaces between the opposing double-sided printed wiring boards 10.

FIG. 4 shows a second embodiment of the present invention. In accordance with the present embodiment, there is provided a multilayer circuit board in which of the mating electrodes arranged in the opposing positions for bonding purposes, at least one of the respective mating electrodes is formed from an exposed metal surface of the metal core substrate and a multilayer structure is provided by a more direct bonding both electrically and mechanically.

Figure 4A:
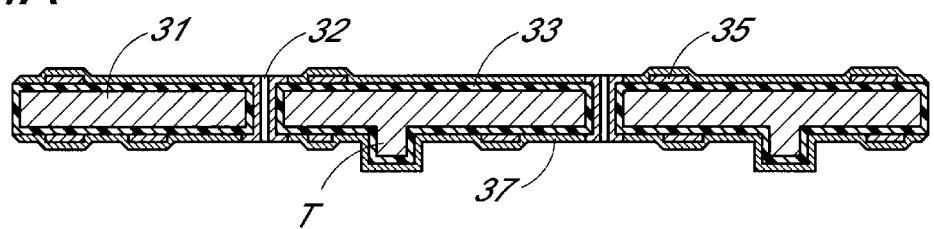
FIGS. 4a to 4c are schematic sectional views showing in the order of processing steps the construction of a double-sided printed wiring board which is a constitutional element of a multilayer circuit board according to a second embodiment of the present invention and a joint to be made during its laminating process.

In the present embodiment, a double-sided printed wiring board 40 is produced by substantially the same processes as the printed wiring board 10 of the first embodiment shown in FIG. 1. More specifically, metal projections T are formed by electroplating at the predetermined regions on a second major surface of a 42 alloy metal core substrate 31 and also the core substrate 31 is formed by etching with through-hole forming apertures 32 extending through the first and second major surfaces. A thin-film layer 33 of polyimide is formed by electrophoretic process on each of the both surfaces of the core substrate 31 including the inner surface of the apertures 32 and copper layers are formed on the polyimide layers 33 by electroless plating and electroplating. The copper layers are subjected to the application, exposure and development of an etching resist to form printed wiring layers 35 and solder resist layers 37 are further formed on the printed wiring layers 35 (FIG. 4a).

Figure 4B:
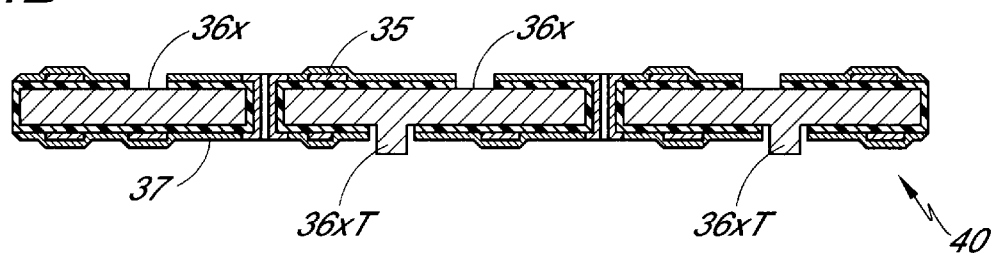

In the present embodiment, however, electrodes 36x formed at the flat regions of the first major surface and electrodes 36xT formed on the top regions of the metal projections T are not formed from the copper layers in the same layers as the printed wiring layers 35 in contrast to the first embodiment. Instead, the metal surfaces of the metal core substrate 31 are selectively exposed by removing the solder resist layers 37 as well as the copper layers and the polyimide layers 33 at the predetermined electrode forming regions thereby utilizing these exposed metal portions as the electrodes 36x and 36xT (FIG. 4b). The selective removing of the copper layers can be effected by etching and also the selective removing of the polyimide layers 33 and the solder resist layers 37 can be effected by the irradiation of a focused carbon dioxide gas laser beam.

Figure 4C:
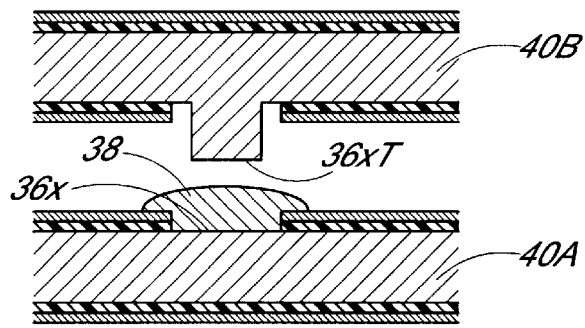
Figure 5A:
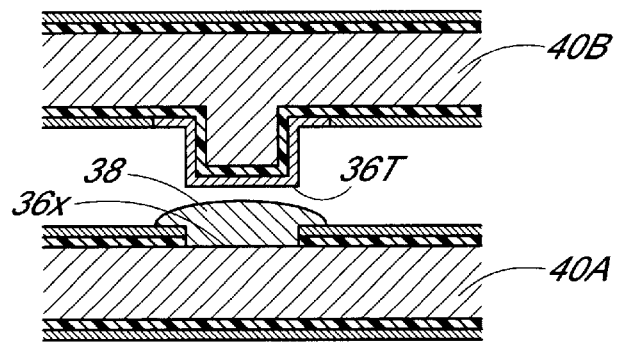
FIGS. 5a and 5b are schematic enlarged sectional views showing two exemplary combinations of bonding electrodes in the laminating process of double-sided printed wiring boards according to the second embodiment.
Figure 5B:
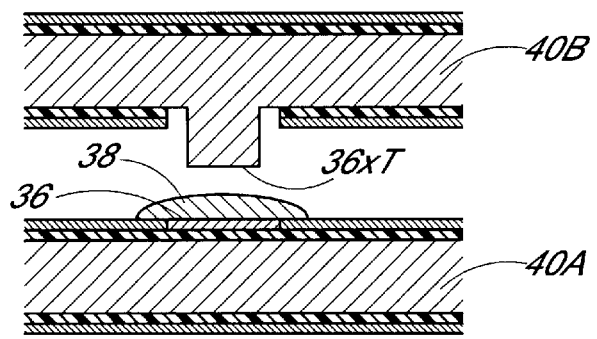

In the bonding form for the mating electrodes of the double-sided printed wiring boards 40 according to the present embodiment, as shown in FIG. 4c, for example, each pair of the opposing exposed metal portions, that is, the electrode 36xT formed on the metal projection T protruding from the second major surface of one printed wiring board and the electrode 36x formed on the flat region of the core substrate of the other printed wiring board are electrically and mechanically bonded with a solder 38. However, the present invention is not limited to this bonding form. As for example, it is possible to use a modification in which an electrode 36x formed from the exposed metal portion on the flat region and an electrode 36T in the same layer as the printed wiring layer 35 on the metal projection are bonded with a solder 38 (FIG. 5a) or another modification in which an electrode 36 in the same layer as the printed wiring layer 35 on the flat region and an electrode 36xT formed from the exposed metal portion on the metal projection are bonded with a solder 38 (FIG. 5b). In the case of these modifications, one of the pair of bonded electrodes is formed from the exposed metal surface of the metal core substrate and thus a higher bonding strength is obtained as compared with the conventional bonded structures in which both of the two electrodes are formed from the printed wiring layers.

In either of these bonding forms, during the forming process of a multilayer structure, a solder paste 38 is first applied by printing coating onto the electrodes (36x or 36) on the side of the first double-sided printed wiring board 40A and then the electrodes (36T or 36xT) on the metal projections on the side of the second double-sided printed wiring board 40B are properly pressed against the solder paste 38. Thereafter, the first and second double-sided printed wiring boards in their laminated state are transferred as such into a reflow furnace and the electrodes are fusion bonded through the solder, thereby producing a multilayer circuit board providing air gaps corresponding to the height of the metal projections T between the respective adjacent wiring boards in the multilayer structure.

Where a multilayer structure is to be produced by laminating a plurality of such double-sided printed wiring boards 40 each having the electrodes formed from the exposed metal portions of the metal core substrate, it is only necessary to similarly bond together the electrodes at the opposing positions of the respective wiring boards through a solder.

It is to be noted that while the above-mentioned second embodiment shows the case in which the metal projections are provided in a dotted form, the present invention is not limited thereto as far as the matter is concerned with the shape of the metal projections. Noting the fact that the metal projections are adapted not only to simply provide bonded joints as the electrodes but also to serve as spacers between the printed wiring boards in the multilayer structure, it is easily understandable for those skilled in the art that the shape and arrangement of the metal projections can be modified in various ways according to the design information of the multilayer circuit board.

Figure 6:
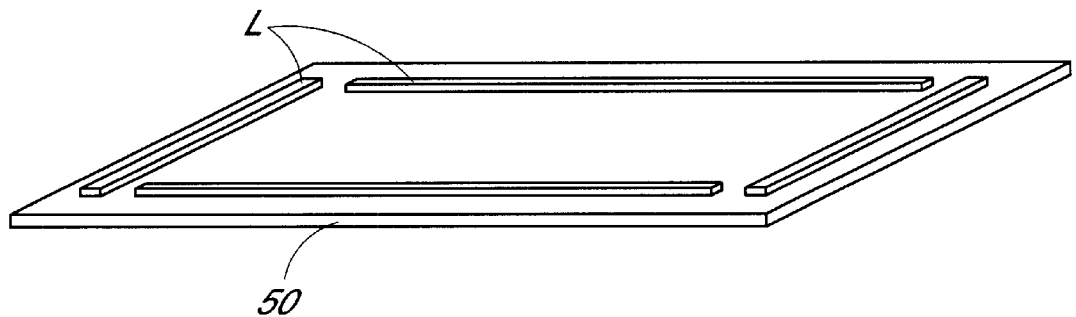
FIG. 6 is a schematic perspective diagram showing an exemplary arrangement of linearly extended metal projections according to a first modification.

For instance, if a plurality of linearly elongated metal projections L are arranged in the form of an enclosing frame along the periphery of a wiring board 50 as shown in FIG. 6, an electromagnetic shielding space can be provided between the adjacent wiring boards in the multilayer structure. Electronic circuitry enclosed within the frame of the metal projections L is protected from the external electromagnetic interference by the electromagnetic shield and conversely EMI noise from the electronic circuitry is prevented from being unnecessarily radiated to the outside.

While the above-described embodiments show the cases in which 42 alloy metal sheets of 100 μm thick are used for the metal core substrates, the present invention is not limited thereto. There is no particular limitation with respect to the thickness of the metal core substrates. From the standpoint of reduction in weight, however, a thickness of 200 μm or less is suitable and more preferably a thickness in the range between 20 and 100 μm is suitable.

Also, as regards the metal materials for the metal core substrates, metals having substantially the same coefficients of linear expansion as silicon chips, such as, metals having low thermal expansion properties including ferro-nickel alloys, e.g., invar and aluminum-silicon type alloys can be widely used in addition to the 42 alloy. Note that it is preferable to apply copper plating to the surface of low linear expansion metals for the purpose of improving the wettability for solder and conductivity.

Further, while, in the above-mentioned embodiments, the metal projections are formed by plating, the metal projections of the present invention are not limited to one formed by this method and the metal projections can also be made by a selective etching treatment of the metal core substrate or the press working of a metal sheet.

Figure 10:
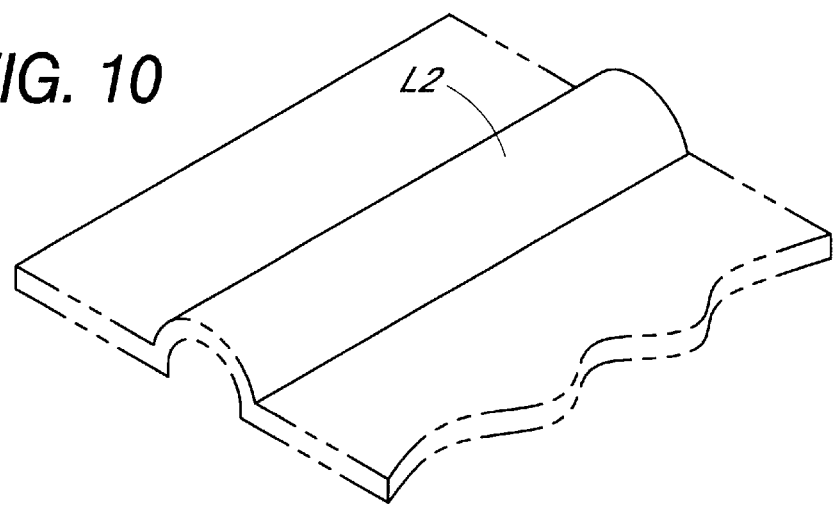
FIG. 10 is a schematic perspective view showing a metal projection according to a fifth modification.
Figure 7A:
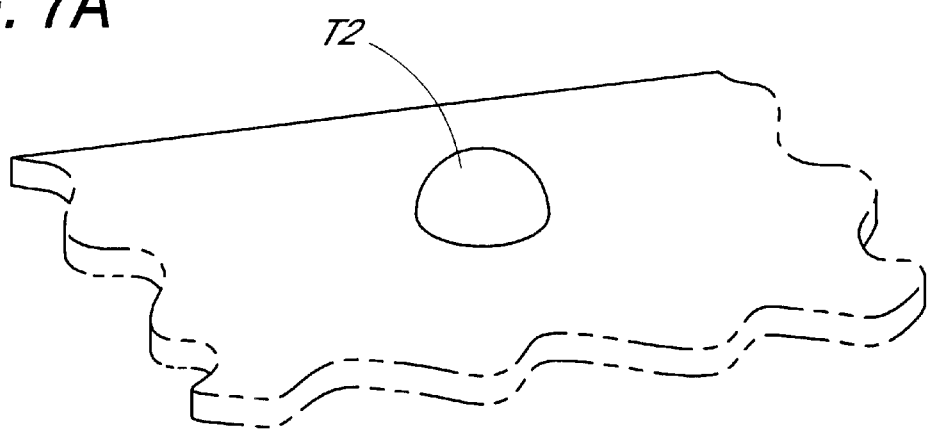
FIGS. 7a and 7b are respectively a schematic perspective view of a metal projection and a schematic enlarged view of a bonded joint according to a second modification.
Figure 7B:
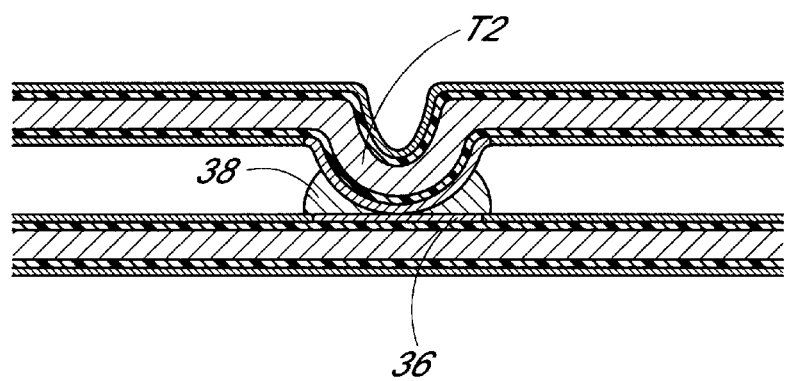
Figure 8A:
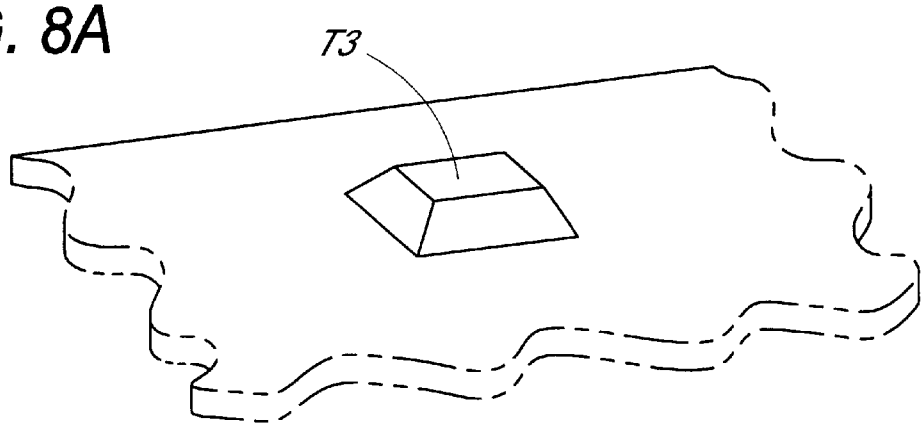
FIGS. 8a and 8b are respectively a schematic perspective view of a metal projection and a schematic enlarged sectional view of a bonded joint according to a third modification.
Figure 8B:
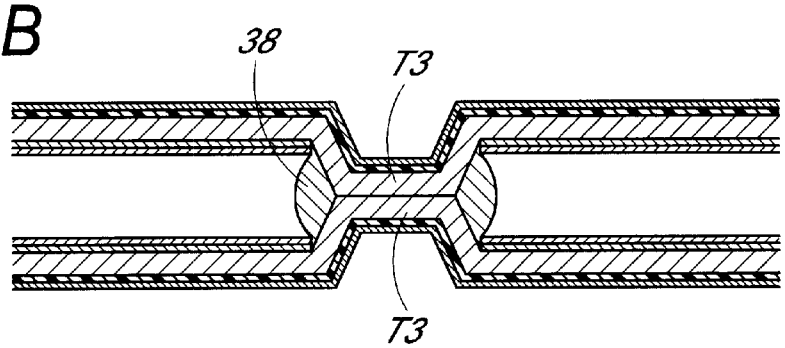
Figure 9A:
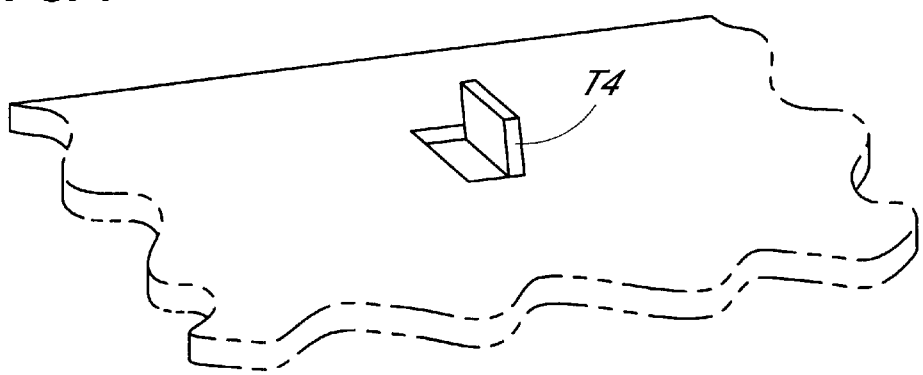
FIGS. 9a and 9b are respectively a schematic perspective view of a metal projection and a schematic enlarged sectional view of a bonded joint according to a fourth modification.
Figure 9B:
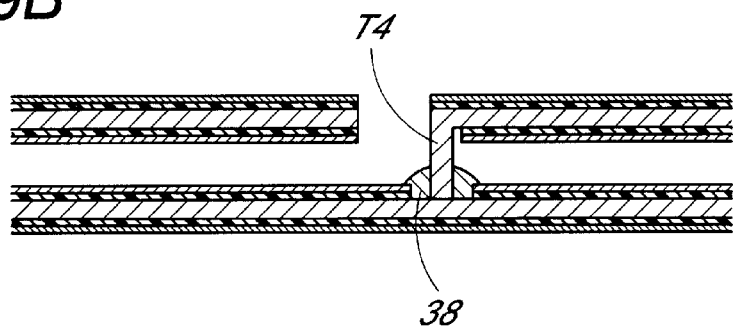

For instance, a semispherical metal projection T2 shown in FIGS. 7a and 7b and a trapezoidal metal projection T3 shown in FIGS. 8a and 8b can be formed by the working of a forming press. Also, as shown in FIGS. 9a and 9b, a metal projection T4 can be formed by causing a part of a metal sheet to project by a blanking press. When forming a multilayer structure, it is sufficient to effect the desired solder bonding corresponding to each projection shape. Also, as shown in FIG. 10, a linearly elongated metal projection L2 can be formed by press working. It is to be noted that while, the foregoing embodiments show the cases in which the insulating layers are formed by the electrophoretic process of polyimide, any other method can be used. For instance, it is possible to use a method in which a half-cured sheet of epoxy is laminated on each side of a metal core substrate preliminarily formed with apertures therethrough by a press machine while simultaneously subjecting the sheets to heat curing and then a carbon dioxide gas laser having a smaller spot diameter than the aperture diameter is irradiated into the apertures to form throughholes in the sheets.

What is claimed is:

1. A multilayer circuit board having a multilayer structure, comprising:

a plurality of printed wiring boards including at least a first printed wiring board and a second printed wiring board, wherein each of said first and second printed wiring boards includes a metal core substrate having a first major surface and a second major surface which are opposite and parallel to each other;

an electrically insulating layer at least partially covering each of the major surfaces;

a conductive printed wiring layer formed on the surface of said electrically insulating layer and including a plurality of wiring lines;

a solder resist layer partially covering the surface of said conductive printed wiring layer; and wherein each metal substrate comprises a plurality of integral metal projections made of the same metal material in a single continuous piece as that of the metal core substrate, said projections being of a predetermined height on at least one of said first major surface or said second major surface so as to provide an air gap between the adjacent printed wiring boards in said multilayer structure, wherein the metal core substrate of said first printed wiring board and the metal core substrate of said second printed wiring board are made of the same metal material with each other; and wherein said solder resist layer comprises at least one local opening for exposing metal surface at a region corresponding to at least one of said metal projections.

2. A multilayer circuit board according to claim 1, wherein said metal core substrate comprises at least one aperture preliminarily formed through and between said first and second major surfaces to form a through-hole, and wherein said conductive printed wiring layer includes a through-hole conductive portion on an inner surface of said aperture.

3. A multilayer circuit board according to claim 1, wherein each of said metal projections includes an exposed metal top.

4. A multilayer circuit board according to claim 1, wherein each of said metal projections includes an exposed metal surface layer formed by plating said metal core substrate with a metal.

5. A multilayer circuit board according to claim 1, wherein each of said metal projections has a top covered with an electrically insulating layer on which an exposed metal surface layer is formed by plating a metal.

6. A multilayer circuit board according to claim 5, wherein said exposed metal surface layer constitutes a part of said conductive printed wiring layer.

7. A multilayer circuit board according to claim 1, wherein each of said metal projections includes a protrusion formed from said metal core substrate by press forming.

8. A multilayer circuit board according to claim 1, wherein each of said metal projections includes a protrusion left after an etching treatment of said metal core substrate.

9. A multilayer circuit board according to claim 1, wherein the second major surface of said first printed wiring board and the first major surface of said second printed wiring board face each other through an air gap in said multi layer structure, and wherein each metal substrate includes a combination of a metal projection formed on one of said second major surface of said first printed wiring board and said first major surface of said second printed wiring board and a local exposed metal portion provided on the other of said second major surface of said first printed wiring board and said first major surface of said second printed wiring board at a position in alignment with said metal projection.

10. A multilayer circuit board according to claim 9, wherein said exposed metal portion is formed from a part of a surface of said metal core substrate or of said conductive printed wiring layer.

* * * * *

UNITED STATES PATENT AND TRADEMARK OFFICE
CERTIFICATE OF CORRECTION

PATENT NO. : 6,653,572 B2
DATED : November 25, 2003
INVENTOR(S) : Ishiwa et al.

It is certified that error appears in the above-identified patent and that said Letters Patent is hereby corrected as shown below:

Column 11,
Line 46, which reads "hoards", should read -- boards --.

Signed and Sealed this

First Day of February, 2005

JON W. DUDAS
*Director of the United States Patent and Trademark Office*